United States Patent [19]
Liu et al.

[11] Patent Number: 5,489,540
[45] Date of Patent: Feb. 6, 1996

[54] METHOD OF MAKING SIMPLIFIED LDD AND SOURCE/DRAIN FORMATION IN ADVANCED CMOS INTEGRATED CIRCUITS USING IMPLANTATION THROUGH WELL MASK

[75] Inventors: Yowjuang W. Liu, San Jose; Kuang-Yeh Chang, Los Gatos, both of Calif.

[73] Assignee: Advanced Micro Devices Inc., Sunnyvale, Calif.

[21] Appl. No.: 408,615

[22] Filed: Mar. 22, 1995

[51] Int. Cl.$^6$ ................................................. H01L 21/8228
[52] U.S. Cl. .................... 437/30; 437/34; 437/44; 437/57; 437/931
[58] Field of Search ..................... 437/30, 34, 44, 437/57, 931

[56] References Cited

U.S. PATENT DOCUMENTS

| | | | |
|---|---|---|---|
| 4,764,477 | 8/1988 | Chang et al. | 437/29 |
| 4,968,639 | 11/1990 | Bergonzoni | 437/57 |
| 4,997,782 | 3/1991 | Bergonzoni | 437/44 |

Primary Examiner—George Fourson
Assistant Examiner—Richard A. Booth
Attorney, Agent, or Firm—Townsend and Townsend and Crew

[57] ABSTRACT

A novel CMOS fabrication process that eliminates several masks of a conventional process by delaying application of a well mask to a semiconductor structure until after formation of isolation regions and gate structures. Providing for three separate implant steps and selectively implanting dopants through an exposure window of the well mask, through gate structures, and through the well mask allows formation of the well region, and source/drain regions in the well region, and in the region covered by the well mask. When LDD implants are desired, removal of a lateral spacer on the gate overlying the well region and subsequent LDD implant through the mask region introduces the LDD implant. Separate masks for source/drain regions and LDD regions are not required. In an alternate embodiment, the LDD implant is introduced prior to formation of lateral spacers on gate structures and application of the well mask, providing the LDD implant in both channels, and eliminating a requirement for lateral spacer removal.

11 Claims, 6 Drawing Sheets

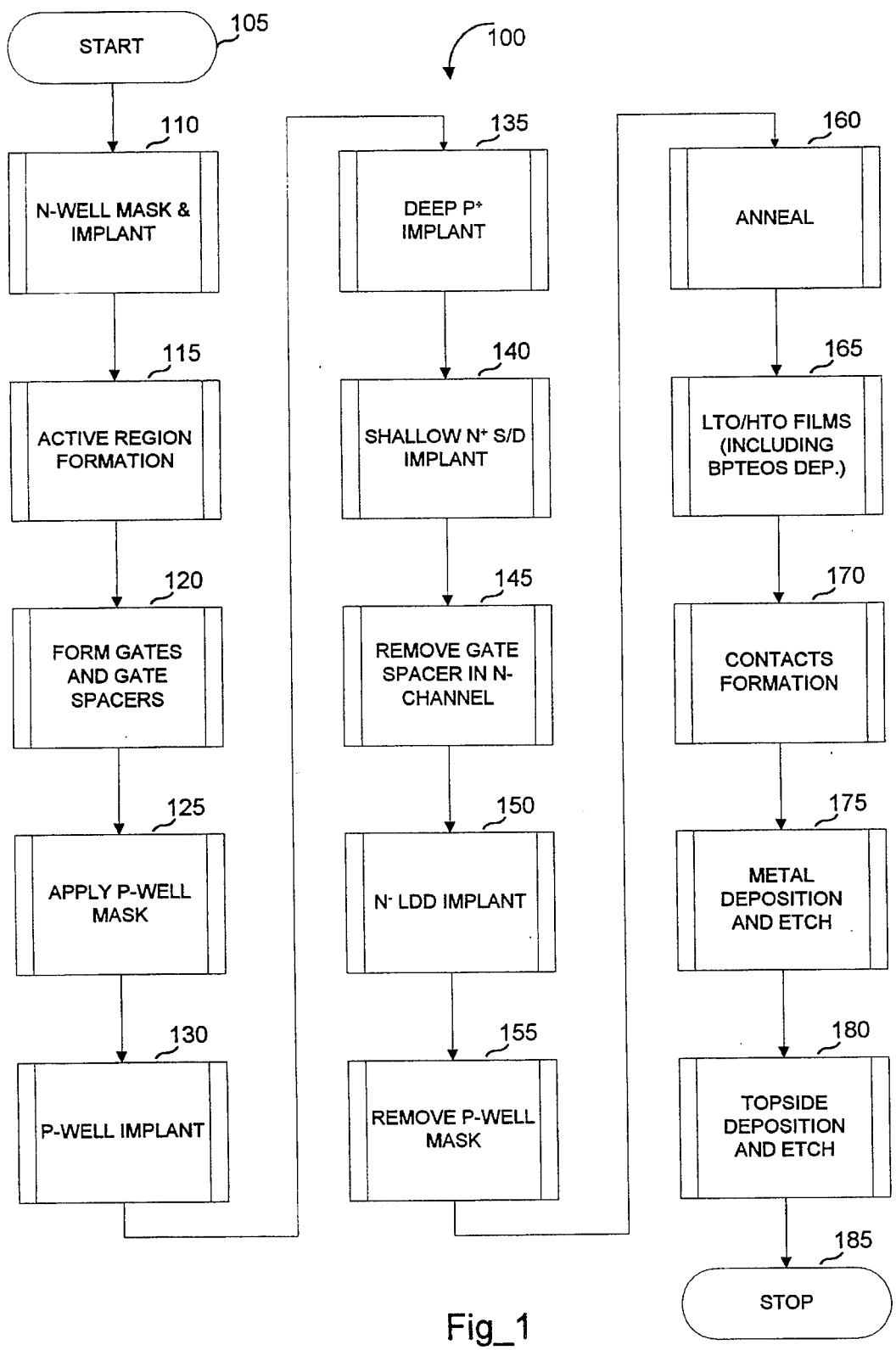
Fig_1

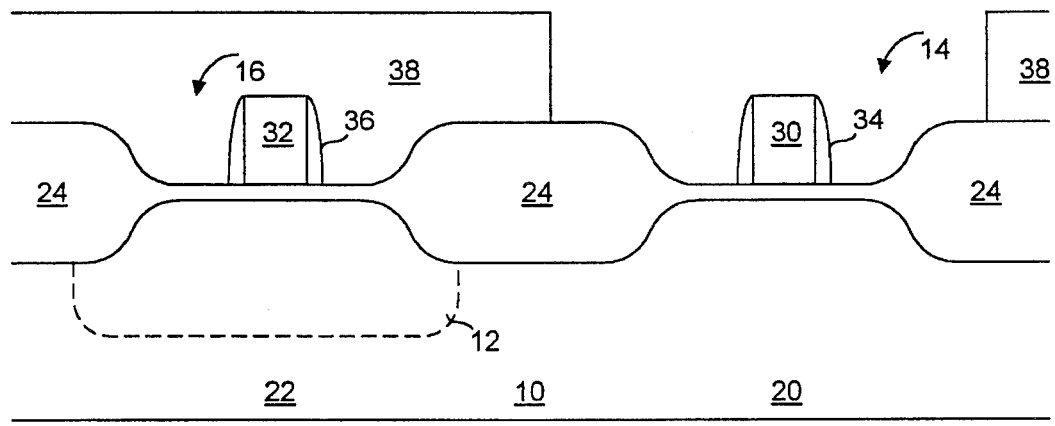
Fig_2
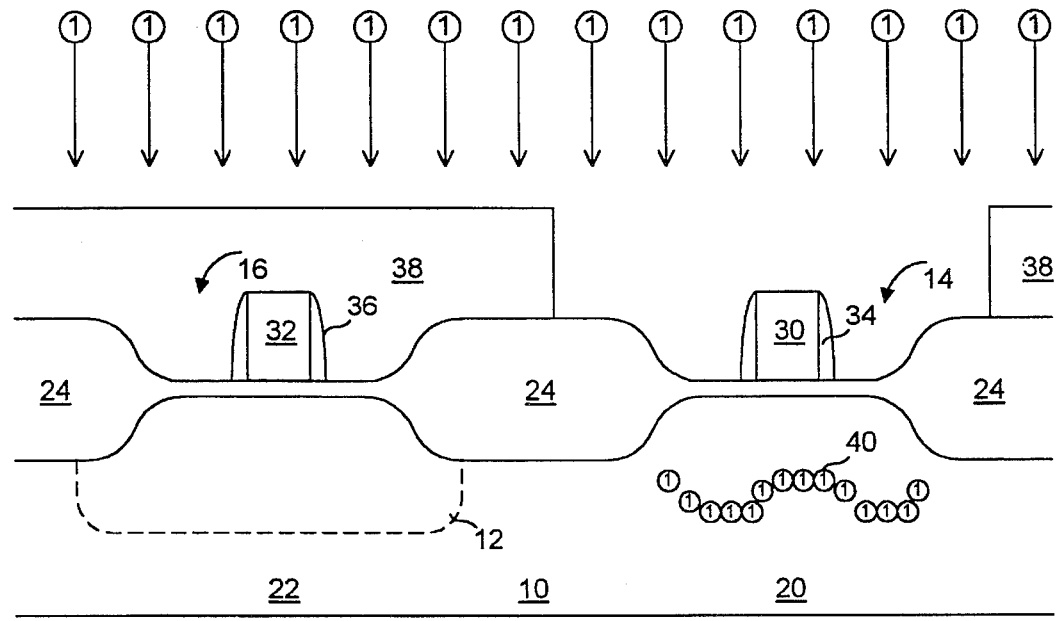
① p-well implant
Fig_3

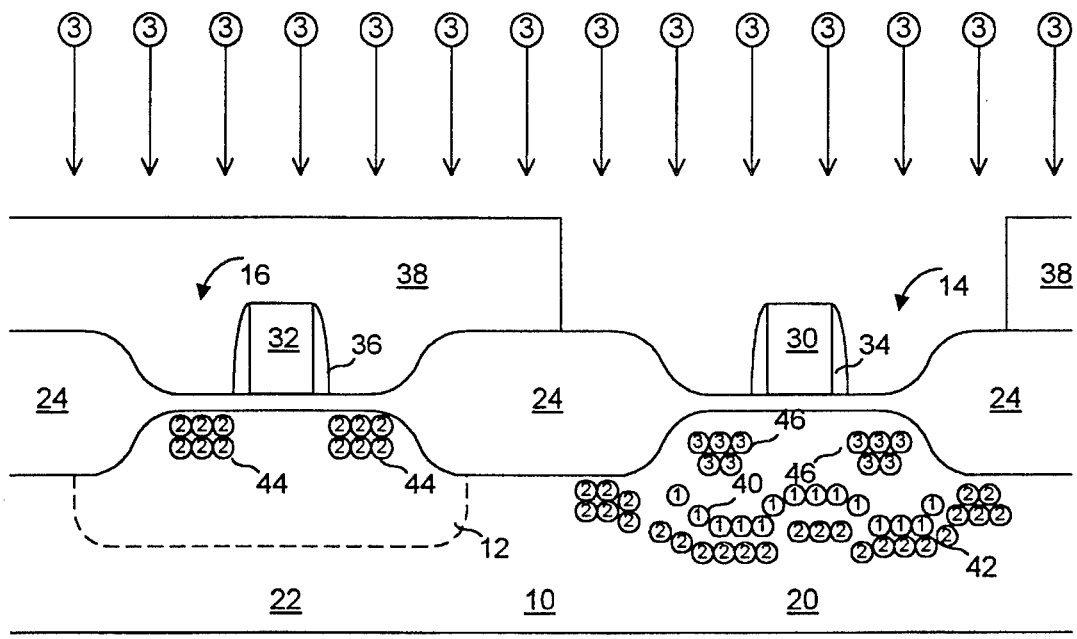
- ① p-well implant
- ② HE p+ S/D implant
- ③ S/D implant
Fig_5
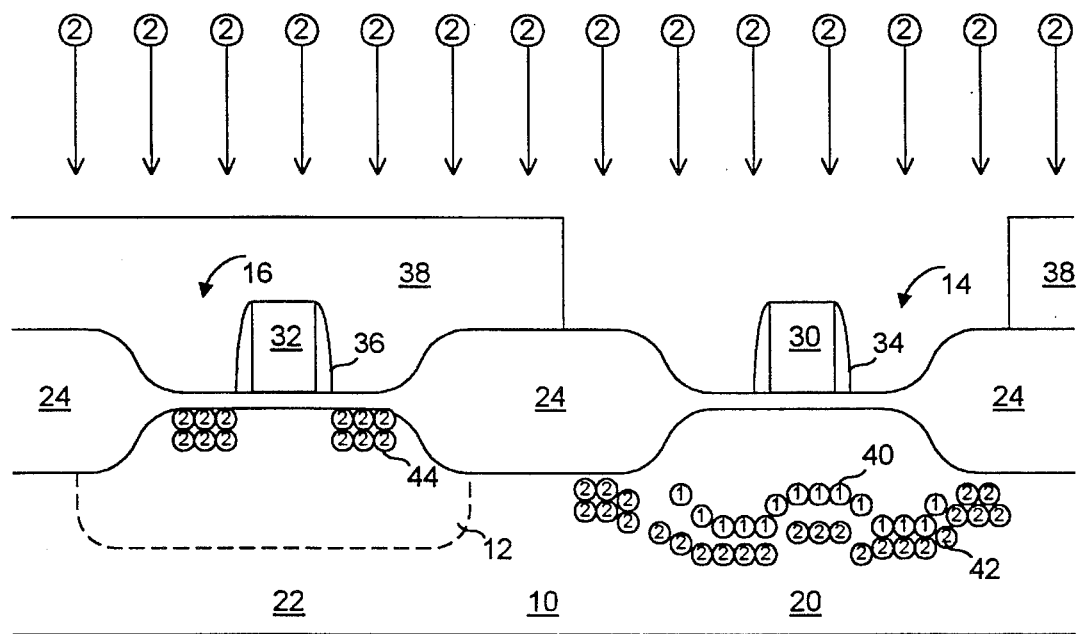
- ① p-well implant
- ② HE p+ S/D implant
Fig_4

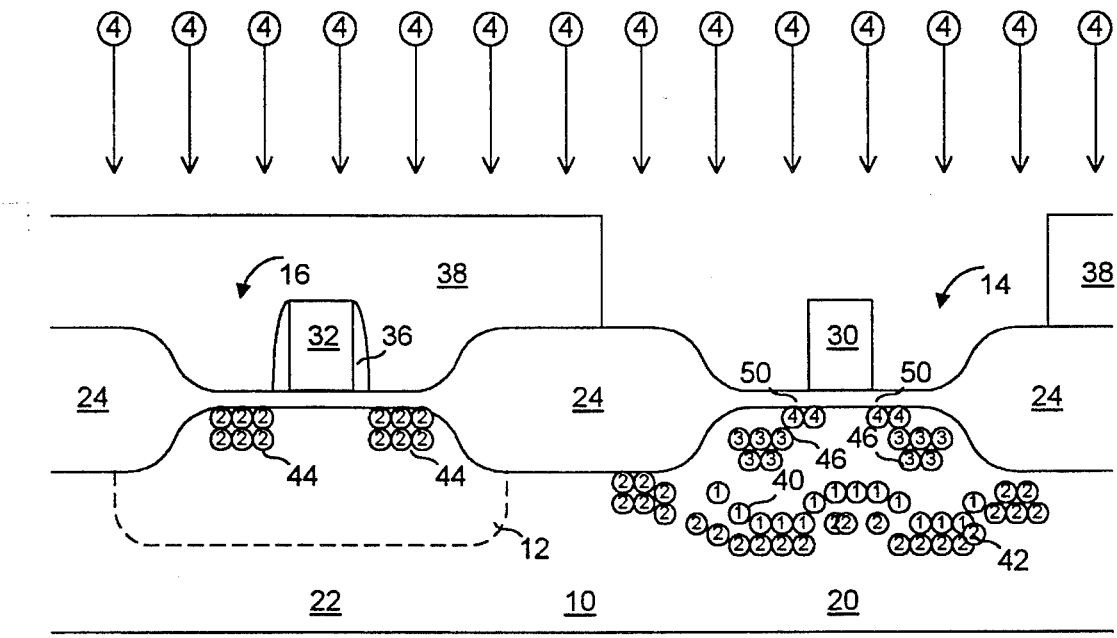
① p-well implant
② HE p+ S/D implant
③ S/D implant
④ LDD implant
FIG_6
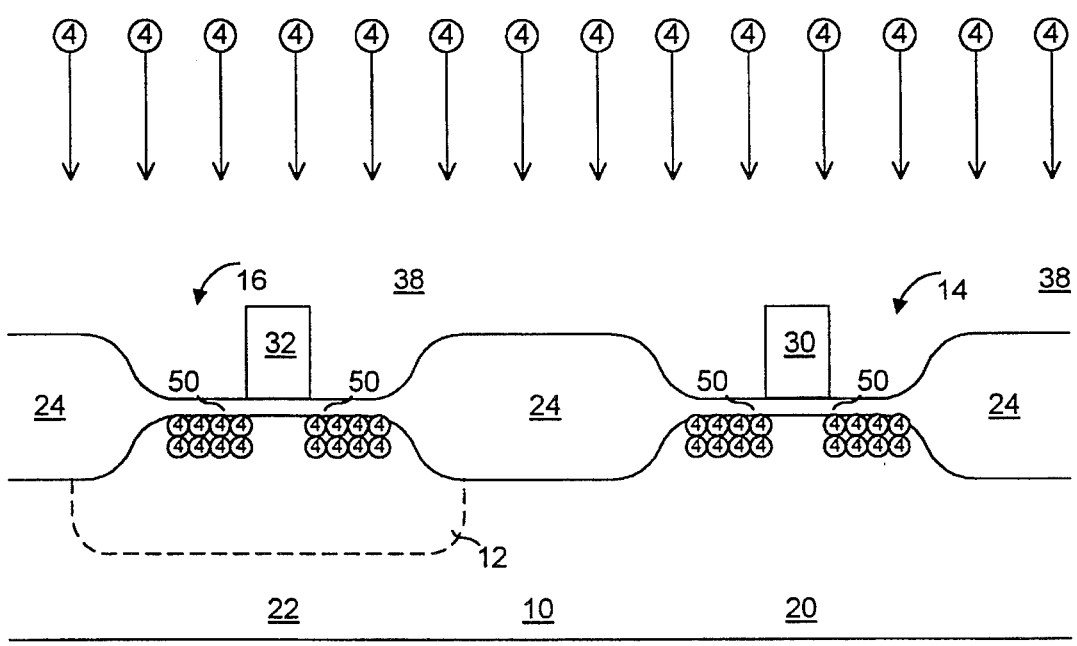
④ LDD implant
FIG_7

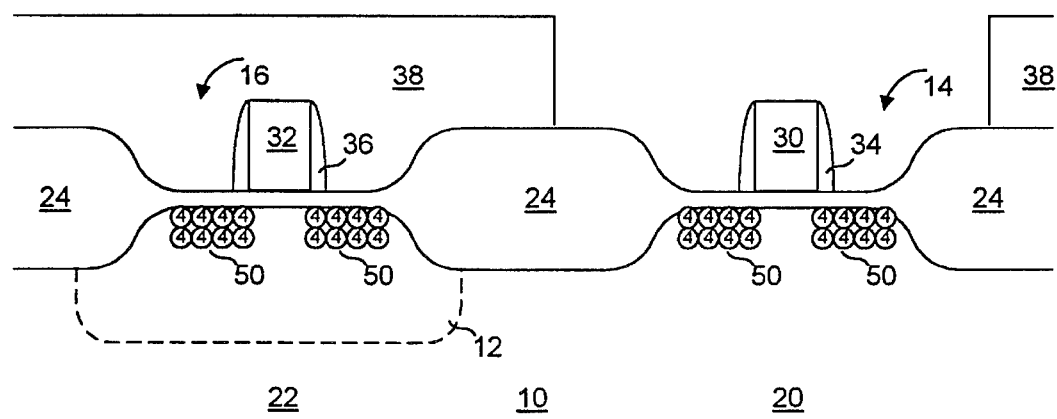
FIG_8
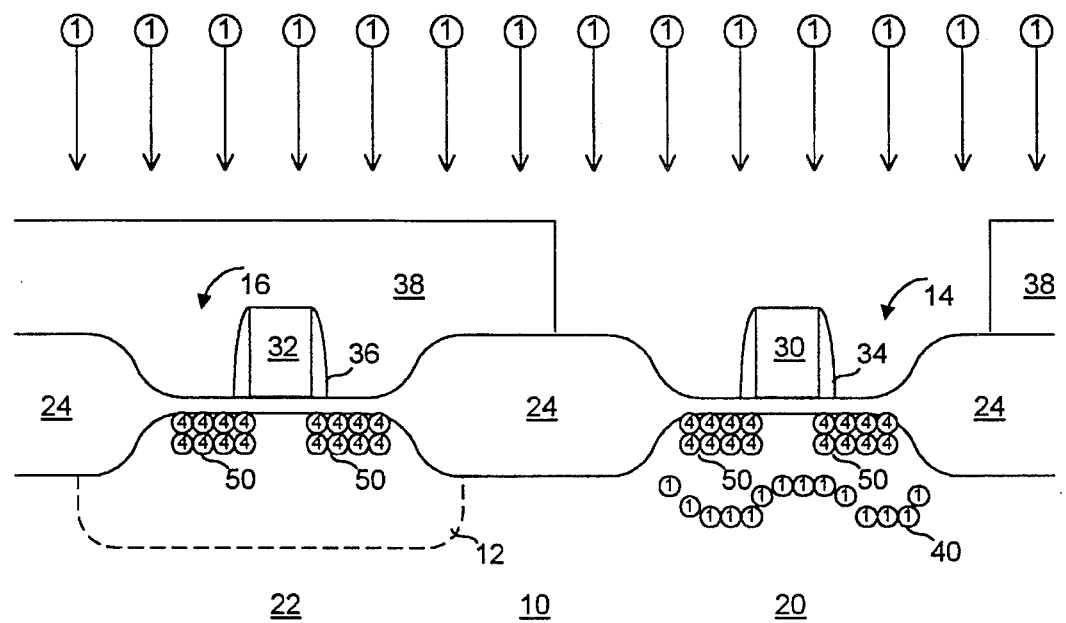
FIG_9

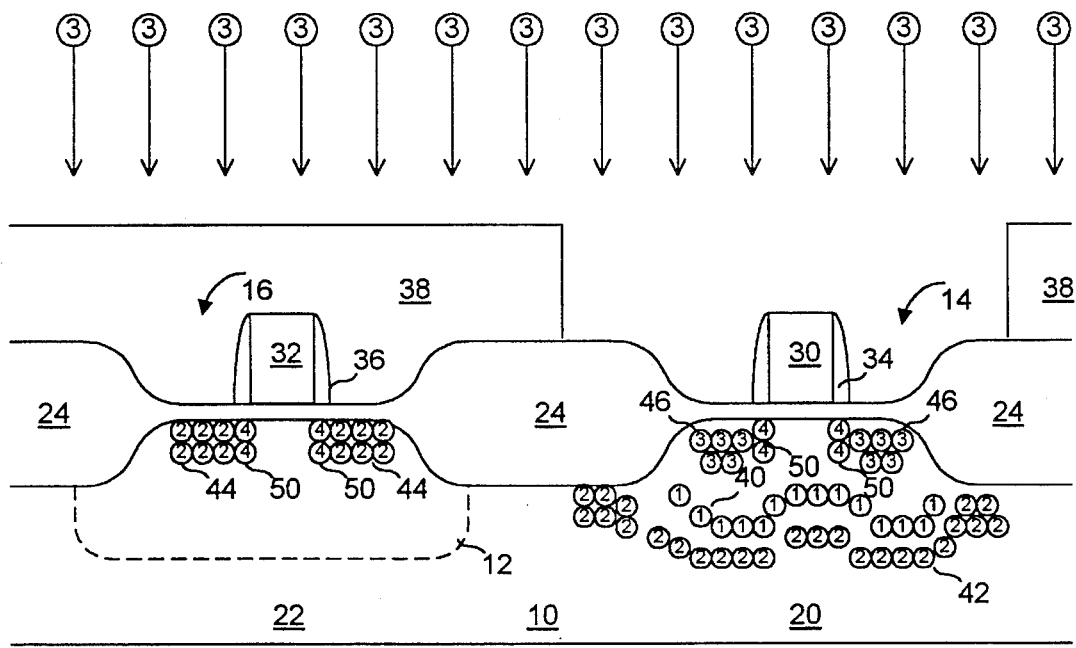
FIG_11
- ④ LDD implant
- ① p-well implant
- ② HE p+ S/D implant
- ③ S/D implant
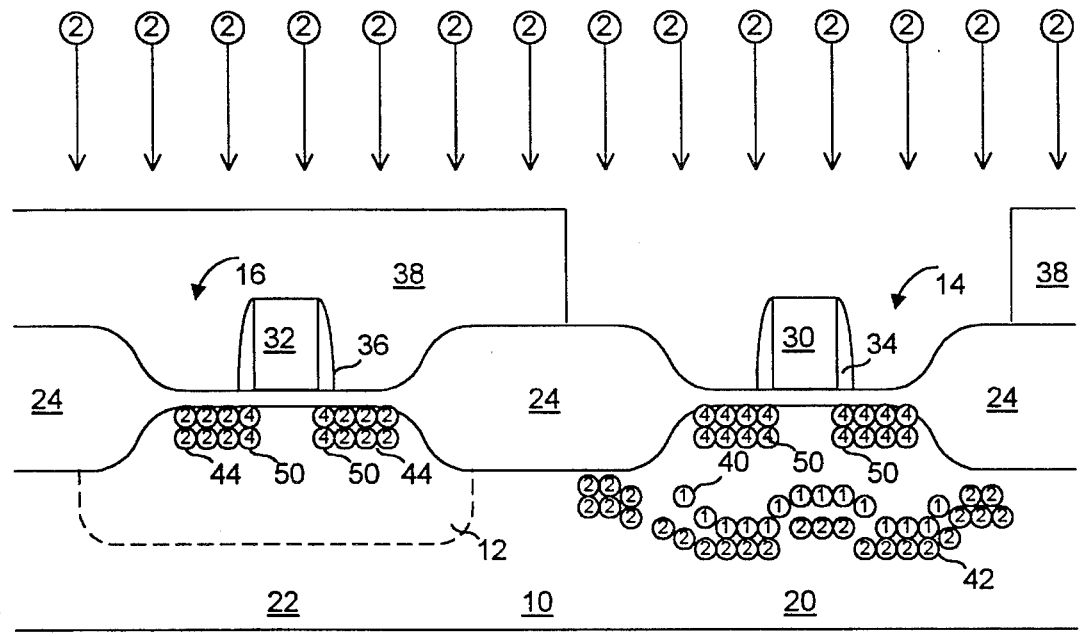
FIG_10
- ④ LDD implant
- ① p-well implant
- ② HE p+ S/D implant

5,489,540

METHOD OF MAKING SIMPLIFIED LDD AND SOURCE/DRAIN FORMATION IN ADVANCED CMOS INTEGRATED CIRCUITS USING IMPLANTATION THROUGH WELL MASK

BACKGROUND OF THE INVENTION

The present invention relates generally to an improvement in semiconductor fabrication processes, and more particularly, to an improvement in processes to form complementary metal oxide semiconductor (CMOS) transistors, particularly to CMOS devices having lightly doped drains, and source/drain active regions.

Conventional CMOS processes form MOS transistors by employing a number of steps, many of which require application of a specialized mask, introduction of dopants with the mask, and removal of the mask followed by another mask. The number of process steps required, and the number of masks required, are measures of a complexity of the semiconductor fabrication process. Decreasing both the number of masks, and the number of steps required to produce the semiconductor device, are desirable goals.

CMOS devices typically include two adjacent transistors, an n-channel transistor and a p-channel transistor, as well known. A conventional process will typically have separate masking steps for lightly doped drain implants in the n-channel transistors, and in the p-channel transistors, as well as separate source/drain implant masks for n conductivity type dopants and p-conductivity type dopants.

Conventional processes may also use p-well masks, and n-well masks to define the channel regions in the CMOS device. These masks, when used, are applied early in the processing sequence, typically before formation of gate structures.

A CMOS fabrication process that can simplify the formation of transistors without degrading their performance is desirable. Especially desirable would be an improved CMOS fabrication process that not only simplifies existing processes, but also that allows implementation of features that enhance performance over transistors made with conventional processes.

SUMMARY OF THE INVENTION

The present invention provides apparatus and method for simply, efficiently and economically producing lightly doped drain (LDD) transistors in advanced CMOS integrated circuits. A preferred embodiment of the present invention allows formation of the LDD transistors while eliminating a requirement for use of three to four masks that heretofore had been used to fabricate LDD transistors in a CMOS device.

According to one aspect of the invention, the process includes the step of delaying application of a well mask until after formation of isolation regions and gate structures. Four separate and distinct implants are made while the well mask is applied, resulting in formation of a first well, source/drain regions in the first well, source/drain regions in a second well, and LDD regions in the first well.

The preferred embodiment includes the steps of forming, in an n substrate, a p-channel region and an n-channel region separated from said p-channel region by an isolation region. Afterwards, gate structures are formed overlying portions of the p-channel and n-channel regions. Lateral spacers are formed on the gate structures, if desired. A p-well mask is applied after formation of the isolation region and gate structures, rather than earlier as typical in conventional CMOS fabrication. Four implants are made using the p-well mask to complete the preferred embodiment.

A deep p-well implant into the n-channel region passes through the gate structures and forms part of the p-well. A deep high voltage implant passes through the p-well mask to form source/drain regions in the p-channel region, and additionally forms a bottom and side (under isolation region) contour of the p-well. A third implant into the n-channel region forms the source/drain regions in the p-well. When desired, a LDD region for the n-channel device is available by removing the lateral spacer off of the gate structure in the n-channel region and introducing an LDD implant into the source/drain regions of the n-channel region.

In some embodiments, it may be desirable to have LDD implants under the source/drain regions of the p-channel region. An alternate preferred embodiment to satisfy this desire is to introduce the LDD implant prior to spacer formation on gate structures and prior to application of the p-well mask. Thereafter, any desired lateral spacers are formed over the LDD implant, and the previously described process is carried out to form the p-well and source/drain regions. This alternate process eliminates the step of removing the lateral spacer and results in formation of LDD implants in the p-channel region in addition to the n-channel region.

Reference to the remaining portions of the specification, including the drawing and claims, will realize other features and advantages of the present invention. Further features and advantages of the present invention, as well as the structure and operation of various embodiments of the present invention, are described in detail below with respect to accompanying drawing. In the drawing, like reference numbers indicate identical or functionally similar elements.

BRIEF DESCRIPTION OF THE DRAWINGS

FIG. 1 is a flow chart identifying a preferred embodiment of the invention;

FIG. 2 is a partial, sectional view of a portion of a semiconductor substrate after formation of a gate and lateral spacer and application of a first well implant mask;

FIG. 3 is a partial, sectional view of the portion of the substrate shown in FIG. 2 receiving a first implant through the implant mask;

FIG. 4 is a partial, sectional view of the portion of the substrate shown in FIG. 3 receiving a high energy source/drain implant;

FIG. 5 is a partial, sectional view of the substrate shown in FIG. 4 receiving a regular source/drain implant;

FIG. 6 is a partial, sectional view of the portion of the substrate shown in FIG. 5 receiving an LDD implant after removal of the lateral spacer on the gate;

FIG. 7 is a partial, sectional view of a portion of a semiconductor substrate illustrating an alternate preferred embodiment wherein the LDD implant is introduced prior to formation of lateral spacers on the gate and application of the implant mask;

FIG. 8 is a partial, sectional view of the portion of the substrate shown in FIG. 7 after application of the implant mask;

FIG. 9 is a partial, sectional view of the portion of the substrate shown in FIG. 8 receiving the first implant;

FIG. 10 is a partial, sectional view of the portion of the substrate shown in FIG. 9 receiving the high energy source drain implant; and FIG. 11 is a partial, sectional view of the portion of the substrate shown in FIG. 10 receiving the source/drain implant.

DESCRIPTION OF THE PREFERRED EMBODIMENT

FIG. 1 is a flow chart identifying a preferred embodiment for an improved CMOS fabrication process 100. CMOS fabrication process 100 includes a number of steps, identified as step 105–step 185. In the interests of simplifying the description, specific types of dopant conductivity types will be identified. It is well understood that different dopant conductivity types may be substituted for the specific ones described herein without departing from the scope of the present invention. Additionally, to facilitate a description of the process, FIG. 2–FIG. 11 represent selected ones of the steps applied to a semiconductor substrate.

FIG. 2 is a partial, sectional view of a portion of a semiconductor substrate 10 showing the results of application of step 105–step 125 shown in FIG. 1. CMOS fabrication process 100 begins as step 105, START, with an n conductivity type substrate 10. After START 105, CMOS fabrication process 100 advances to step 110, an optional n-well step 110. N-well step 110 optionally masks portions of the substrate and implants n-well dopants to provide an optional n-well 12. Additionally, n-well step 110 includes an n-well drive to obtain a desired profile for the n-well.

Next, an active region formation step 115 provides for formation of an n-channel active region 14 and a p-channel active region 16. These active regions receive source/drain dopants for both an n-channel region 20 and a p-channel region 22. Active region formation step 115 includes formation of an isolation region 24 separating active region 14 from active region 16.

Following step 115, CMOS fabrication process 100 has a gate formation step 120. Gate formation step 120 forms a gate 30 in n-channel active region 14 and a gate 32 in p-channel active region 16. A lateral spacer 34 and a lateral spacer 36 are formed on the gates. Specifically, lateral spacer 34 is formed on gate 30 and lateral spacer 36 is formed on gate 32.

It is not until after gate formation step 120 that CMOS fabrication process 100 performs a p-well mask application step 125. P-well mask application step 125 applies a p-well mask 38 over substrate 10 to cover p-channel 22 structures, and to expose n-channel 20. P-well mask 38 has a thickness $T_{pw}$ that is adjustable as described more fully below. In the preferred embodiment, p-well mask 38 is conventional resist, and $T_{pw}$ has a range of about 0.5 micrometers to about 2.5 micrometers, as qualified by the description below.

FIG. 3 is a partial, sectional view of the portion of the substrate shown in FIG. 2 receiving a first implant through implant mask 38. Following p-well mask application step 125, CMOS fabrication process 100 implants p-well dopants deep into n-channel region 20 at step 130. The p-well dopants are implanted through gate 30 and lateral spacer 34 to provide a varying depth contour p-well implant 40 in n-channel region 20. P-well implant 40 is closer to gate 30 than to other parts of n-channel active region 14.

In the preferred embodiment, p-well implant 40 results from a boron implant having a dose in a dose range of about $1 \times 10^{12}$ to about $1 \times 10^{14}$ atoms/cm$^3$ and an energy in a range of about 25 keV to about 150 keV. A first limitation on $T_{pw}$ is that it be thick enough to inhibit introduction of p-well dopants into p-channel 22.

FIG. 4 is a partial, sectional view of the portion of substrate 10 shown in FIG. 3 receiving a high energy source/drain implant. Following p-well implant step 130, CMOS fabrication process 100 performs a deep p conductivity implant step 135. Deep p conductivity type implant step 135 serves two purposes: it implants a deep p conductivity type implant 42 to form a bottom of a p-well in n-channel 20, and it introduces a p conductivity type source/drain implant 44 into p-channel 22. Deep p conductivity type implant 42 has a varying depth contour to match p-well implant 40 as it also is introduced through gate 30 and lateral spacer 34, as well as being implanted through portions of isolation region 24 to produce the p-well.

Source/drain implant 44 provides source/drain regions for p-channel active region 16. Deep p conductivity type implant step 135 introduces source/drain implant 44 through p well mask 38. Source/drain implant 44 is self-aligned with gate 32 and spacer 36 because implant step 135 does not introduce dopants through both p well mask 38 and gate 32. Therefore, a second limitation on $T_{pw}$ is that it be thin enough to allow deep p conductivity type implant step 135 to introduce source/drain implant 44 into p-channel active region 16. In the preferred embodiment, deep p conductivity type implant 135 is a boron implant having a dose in a dose range of about $5 \times 10^{14}$ to about $5 \times 10^{16}$ atoms/cm$^3$, and an energy in an energy range of about 100 to about 300 keV.

Following deep p conductivity-type implant step 135 is a shallow source/drain implant step 140. Source/drain implant step 140 implants a source/drain implant 46 into n-channel active region 14. Source/drain implant 46 is near a surface of n-channel active region 14 and is self-aligned with gate 30 and lateral spacer 34. FIG. 5 is a partial, sectional view of substrate 10 shown in FIG. 4 receiving regular source/drain implant 46. Since $T_{pw}$ is thick enough to inhibit introduction of p well implant 40, it inhibits introduction of source/drain implant 46 into p-channel region 22. In the preferred embodiment, source/drain implant step 140 is an arsenic implant having a dose in a dose range of about $1 \times 10^{15}$ to about $1 \times 10^{16}$ atoms/cm$^3$ and an energy in an energy range of about 20 keV to about 100 keV.

After shallow source/drain implant step 140, CMOS fabrication process 100 removes lateral spacer 34 on gate 30 in n-channel region 20 (step 145). Following step 145, a lightly doped drain (LDD) implant 50 is introduced into n-channel active region 14 at an LDD implant step 150. FIG. 6 is a partial, sectional view of the portion of substrate 10 shown in FIG. 5 receiving LDD implant 50 after removal of lateral spacer 34 on gate 30. LDD implant 50 is shallow and lies in a surface of n-channel active region 14 underlying a region previously covered by lateral spacer 34.

P well mask 38 inhibits introduction of dopants of LDD implant 50 into p-channel region 22. In the preferred embodiment, LDD implant step 150 is a phosphorous implant having a dose in a dose range of about $1 \times 10^{12}$ to about $1 \times 10^{14}$ atoms/cm$^3$, and an energy in a range of about 20 keV to about 100 keV.

Following LDD implant step 150, CMOS fabrication process 100 performs conventional process steps to complete formation of a CMOS semiconductor device. After LDD implant step 150, a p-well mask removal step 155 removes p well mask 38 shown in FIG. 6. After p well mask removal step 155, an anneal step 160 forms LDD transistors in n-channel region 20 and non-LDD transistors in p channel region 22. In the embodiment shown in FIG. 2-FIG. 6, it is desirable that anneal step 160 drive source/drain implant 44 in p channel active region 16 under lateral spacer 36 to lie under gate 32. In the preferred embodiment, anneal step 160 is a conventional anneal operated at about 800°–1000° C. for about 1 to about 60 minutes in a furnace in an $N_2$ or $N_2/O_2$ environment. Alternately, an RTA of about 800–1100 C. for about 0.1 to about 10 minutes in an $N_2$ or $N_2/O_2$ environment provides acceptable annealing.

The remainder of steps 165–180 are conventional, with step 165 forming conventional low temperature oxide (LTO) and high temperature oxide (HTO) films, and may include BPTEOS deposition and densification. Step 170, following step 165 forms contacts, and is followed by step 175 for metal deposition and etch. A topside deposition and etch, step 180, completes processing to reach STOP, step 185.

CMOS fabrication process 100 eliminates four masks (an n-type LDD mask, a p-type LDD mask, an n-type source/drain mask, and a p-type source/drain mask. This processing simplicity is partially achieved by applying the p-well mask later in the process and introducing the dopants as described above. This p well mask is already employed in conventional processing, it is used earlier in processing sequence than the present invention however. Other advantages are that the well dopant profiles are retrograde, providing for improved circuit performance, better n-channel short channel control with low source/drain junction capacitances, and improved immunity to latch-up, better p channel performance without LDD junction in p channel, n channel isolation is improved, and process integration has flexibility.

In some embodiments, it may be desirable to have LDD transistors in both the n-channel and the p-channel. FIG. 7–FIG. 11 illustrate an alternate embodiment simply adapting CMOS process 100 described above to provide LDD transistors in both the n-channel and the p-channel of a CMOS device. FIG. 7 is a partial, sectional view of a portion of a semiconductor substrate illustrating an alternate preferred embodiment wherein the LDD implant is introduced prior to formation of lateral spacers on the gate and application of the implant mask.

In step 120 identified above, LDD implant step 150 is performed after gate formation but prior to formation of lateral spacers, rather than after removal of lateral spacers in step 145. Moving step 150 earlier in the sequence of steps actually eliminates step 145, as spacer removal will no longer be necessary. Note that in FIG. 7, LDD implant 50 is in both n-channel active region 14 and in p-channel active region 16. After the LDD implant step is performed, step 120 is completed to form lateral spacers.

In an alternate preferred embodiment, rather than introducing the n-type LDD implant, a p-type LDD implant may be introduced after gate formation but prior to lateral spacer formation. In still another alternate preferred embodiment, two different LDD implants may be made, one before spacer formation and one after the source/drain implant and spacer removal. For example, a p-type LDD implant could be made prior to spacer formation, and an n-type LDD implant after source/drain implant and spacer removal, to produce both types of LDD implants.

FIG. 8 is a partial, sectional view of the portion of substrate 10 shown in FIG. 7 after subsequent application of p well mask application step 125. FIG. 9 is a partial, sectional view of the portion of substrate 10 shown in FIG. 8 processed up to step 130 to receive p well implant 40.

FIG. 10 is a partial, sectional view of the portion of substrate 10 shown in FIG. 9 receiving the deep p conductivity type implant from step 135. The deep p-conductivity type implant converts LDD implant 50 in p channel active region 16 to source/drain implant 44 except under lateral spacer 36. FIG. 11 is a partial, sectional view of the portion of substrate 10 shown in FIG. 10 receiving source/drain implant 46 at step 140. Similarly to the process step as shown in FIG. 10, LDD implant 50 in n-channel active region 14 is converted by step 140 to source/drain implant 46, except where LDD implant 50 is covered by lateral spacer 34. As noted above, step 145 is eliminated as removal of the lateral spacers is no longer required, and step 150 has been performed. Thus, the alternate process completes steps 155–185 as described above. The resulting structure is similar to the structure of the first preferred embodiment, with the exception of the LDD transistors in both channels, and that the lateral spacer remains on the gate of the n-channel region.

In conclusion, the present invention provides a simple, efficient solution to a problem of efficient formation of a CMOS device. While the above is a complete description of the preferred embodiments of the invention, various alternatives, modifications, and equivalents may be used. For example, the above description applies to p-type substrate in addition to the described n-type substrate. Therefore, the above description should not be taken as limiting the scope of the invention which is defined by the appended claims.

What is claimed is:

1. A method for forming a complementary metal oxide semiconductor (CMOS) structure, comprising the steps of:

forming, in a substrate, a first active region and an second active region separated from said first active region by an isolation region; thereafter forming a first gate overlying a portion of said first active region; and forming a second gate overlying a portion of said second active region; and thereafter masking said first active region with a well mask having an exposure window to expose said second active region and a portion of said isolation region; thereafter implanting dopants of a first conductivity type through said exposure window and said second gate into said substrate to create a well region of said first conductivity type, said well region having a depth contour;

implanting dopants of a second conductivity type through said exposure window to form a source region and a drain region in said second active region that are each latterly disposed away from said gate in said second active region; and implanting dopants of said first conductivity type through said exposure window to shape said depth contour and through said well mask to form a source region and a drain region in said first active region that are each latterly disposed away from said gate in said first active region.

2. The structure forming method of claim 1 further comprising the steps of:

forming a lateral spacer on each gate after said gate forming steps; thereafter removing said lateral spacer on said gate in said second active region after said implanting step; and thereafter forming a lightly doped drain in said second active region by implanting dopants of said second conductivity type into said second active region.

3. The CMOS forming method of claim 2 wherein said well mask is removed after said step of forming said lightly doped drain.

4. The structure forming method of claim 1 wherein said substrate is said first conductivity type.

5. The structure forming method of claim 1 wherein said first conductivity type is p-type.

6. The structure forming method of claim 5 wherein second conductivity type is n-type.

7. The structure forming method of claim 1 wherein said well region implanting step comprises the step of implanting boron dopants having a dose in a dose range of about $1\times10^{12}/cm^2$ to about $1\times10^{14}/cm^2$ and a dose energy in an energy range of about 25 keV to about 150 keV.

8. The structure forming method of claim 1 wherein said first active source/drain implanting step comprises the step of implanting boron dopants having a dose in a dose range of about $5\times10^{14}/cm^2$ to about $5\times10^{16}/cm^2$ and a dose energy in an energy range of about 100 keV to about 300 keV.

9. A method for forming a complementary metal oxide semiconductor structure, comprising the steps of:

forming, in a substrate, a first active region and an second active region separated from said first active region by an isolation region; thereafter forming a first gate overlying a portion of said first active region; and forming a second gate overlying a portion of said second active region; and thereafter forming a lightly doped drain in said second active region by implanting dopants of a first conductivity type into said second active region and said first active region; and thereafter forming a lateral spacer on each of said gates; thereafter masking said first active region to provide a well mask having an exposure window to expose said second active region and a portion of said isolation region; thereafter implanting dopants of a second conductivity type through said exposure window into said substrate to create a well region of said second conductivity type;

implanting dopants of said first conductivity type through said exposure window to form a source region and a drain region in said second active region that are each latterly disposed away from said gate in said second active region; and implanting dopants of said second conductivity type through said exposure window and through said well mask to form a source region and a drain region in said first active region that are each latterly disposed away from said gate in said first active region.

10. A method for forming a complementary metal oxide semiconductor structure, comprising the steps of:

forming, in a substrate, a first active region and an second active region separated from said first active region by an isolation region; thereafter forming a first gate overlying a portion of said first active region; and forming a second gate overlying a portion of said second active region; and thereafter forming a lightly doped drain in said first active region by implanting dopants of a first conductivity type into said first active region and said second active region; and thereafter forming a lateral spacer on each of said gates; thereafter masking said first active region to provide a well mask having an exposure window to expose said second active region and a portion of said isolation region; thereafter implanting dopants of said first conductivity type through said exposure window into said substrate to create a well region of said first conductivity type;

implanting dopants of a second conductivity type through said exposure window to form a source region and a drain region in said second active region that are each laterally disposed away from said gate in said second active region; and implanting dopants of said first conductivity type through said exposure window and through said well mask to form a source region and a drain region in said first active region that are each laterally disposed away from said gate in said first active region.

11. The structure forming method of claim 10 further comprising the steps of:

removing said lateral spacer on said gate in said second active region after said second conductivity type dopant implanting step; and thereafter forming a lightly doped drain in said second active region by implanting dopants of said second conductivity type into said second active region.

* * * * *